United States Patent
Sanchez

(10) Patent No.: US 9,344,088 B1
(45) Date of Patent: May 17, 2016

(54) DRIVER CIRCUIT RECEIVING A REGULATED PRE-DRIVER SUPPLY VOLTAGE

(71) Applicant: FREESCALE SEMICONDUCTOR, INC., Austin, TX (US)

(72) Inventor: Hector Sanchez, Cedar Park, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/700,250

(22) Filed: Apr. 30, 2015

(51) Int. Cl.
  *H03B 1/00* (2006.01)
  *H03K 3/00* (2006.01)
  *H03K 19/0185* (2006.01)

(52) U.S. Cl.
  CPC .............................. *H03K 19/018521* (2013.01)

(58) Field of Classification Search
  CPC ................. H03K 19/00361; H03K 19/00315; H03K 19/0013
  USPC ................. 327/108–112, 333, 427, 434, 437; 326/82, 83, 80, 63
  See application file for complete search history.

(56) References Cited

U.S. PATENT DOCUMENTS

| | | | | | |
|---|---|---|---|---|---|
| 5,808,480 | A * | 9/1998 | Morris | ........... | H03K 19/018521 326/81 |
| 8,248,152 | B2 * | 8/2012 | Dennard | ................ | H02M 3/07 327/536 |
| 8,754,672 | B2 * | 6/2014 | Dennard | ................. | H03K 3/00 326/101 |
| 2007/0001716 | A1 * | 1/2007 | Sanchez | ......... | H03K 19/018585 327/112 |
| 2008/0143430 | A1 * | 6/2008 | Chen | .................... | G11C 7/1051 327/543 |
| 2012/0262202 | A1 * | 10/2012 | Lee | .................. | H03K 19/00361 326/63 |
| 2013/0093474 | A1 * | 4/2013 | Yang | .................... | H03K 17/063 327/109 |

OTHER PUBLICATIONS

Hsueh et al, "26.4 A 25.6 Gb/s differential and DDR4/GDDR5 dual-mode transmitter with digital clock calibration in 22nm CMOS", IEEE International Solid-State Circuits Conference Disgest of Technical Papers (ISSCC), Feb. 9-13, 2014, pp. 444-445, San Francisco, CA.

Song, "An 8-16 Gb/s, 0.65-1.05 pJ/b, Voltage-Mode Transmitter With Analog Impedance Modulation Equalization and Sub-3 ns Power-State Transitioning", IEEE Journal of Solid-State Circuits, Sep. 15, 2014, pp. 2631-2643, vol. 49, No. 11.

Lin, "A Low Dropout Regulator Using Current Buffer Compensation Technique", IEEE International Conference on Solid-State and Integrated Circuit Technology (ICSICT), Nov. 1-4, 2010, pp. 144-146.

(Continued)

*Primary Examiner* — Lincoln Donovan
*Assistant Examiner* — Thomas Skibinski

(57) ABSTRACT

A driver circuit includes first and second pluralities of series-connected inverters for pre-driving an input signal to first and second drive transistors, and a plurality of capacitors. The first and second drive transistors coupled to the last inverter of the first and second pluralities of series-connected inverters. Each capacitor of the plurality of capacitors coupled between the output terminals of corresponding inverters of the first and second pluralities of series-connected inverters. In another embodiment, a plurality of discharge circuits is coupled to the first plurality of series-connected inverters. Another embodiment includes a combination of capacitors and discharge circuits coupled to the first plurality of series-connected inverters. The embodiments provide a driver circuit with high frequency voltage regulation.

19 Claims, 4 Drawing Sheets

(56) References Cited

OTHER PUBLICATIONS

Bulzacchelli, "Dual-Loop System of Distributed MicroregulatorsWith High DC Accuracy, Load Response TimeBelow 500 ps, and 85-mV Dropout Voltage", Apr. 3, 2012, pp. 863-874, vol. 47, Issue 4.

Leung, "A CMOS Low-Dropout Regulator With a Momentarily Current-Boosting Voltage Buffer", IEEE Transactions on Circuits and Systems I: Regular Papers, Sep. 30, 2010, pp. 2312-2319, vol. 57, Issue 9.

Yu, "A hybrid regulator with boost charge pump and Low-Dropout Linear Regulation", IEEE International Conference on Solid-State and Integrated Circuit Technology (ICSICT), Nov. 1-4, 2010, pp. 587-589.

\* cited by examiner

DRIVER CIRCUIT RECEIVING A REGULATED PRE-DRIVER SUPPLY VOLTAGE

BACKGROUND

1. Field

This disclosure relates generally to semiconductor devices, and more specifically, to high speed driver circuits.

2. Related Art

Semiconductor devices typically use driver circuits to communicate with functional blocks and systems. For example, a system-on-chip SoC may use driver circuits to communicate on-chip between a processor and peripherals, or between the SoC and external peripherals. As process technologies advance, the demand for more complex and higher performance devices increases. Higher performance generally requires communication to occur at faster rates across the chip and with external peripherals. Accordingly, driver circuits are expected to drive signals at higher frequencies. However, the stability of higher frequency driver circuits can be limited by jitter and other undesirable effects.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Driver circuits in multi-voltage domains may use a regulator to provide a voltage in the pre-driver stages to drive suitable voltage levels at the control terminals of the output stage transistors. The embodiments of the present disclosure minimize overall high frequency current demand on the regulator and improves high-frequency voltage regulation, ensuring reduced data-dependent jitter and overall enhanced stability.

In a semiconductor device, core logic generally includes functional blocks which may perform operations, store information, and the like. For example, functional blocks may include a central processing unit (CPU), memory, and peripherals. The functional blocks are generally designed using logic components such as NAND gates, NOR gates, flip-flops, inverters, and the like. Core logic as referred to herein, is logic circuits and components which are formed in a common technology and operate in a common voltage range. Of course, core logic can be partitioned along functional block boundaries, for example, such that a functional block can be powered down or operated at a different voltage than other functional blocks.

Figure 1:
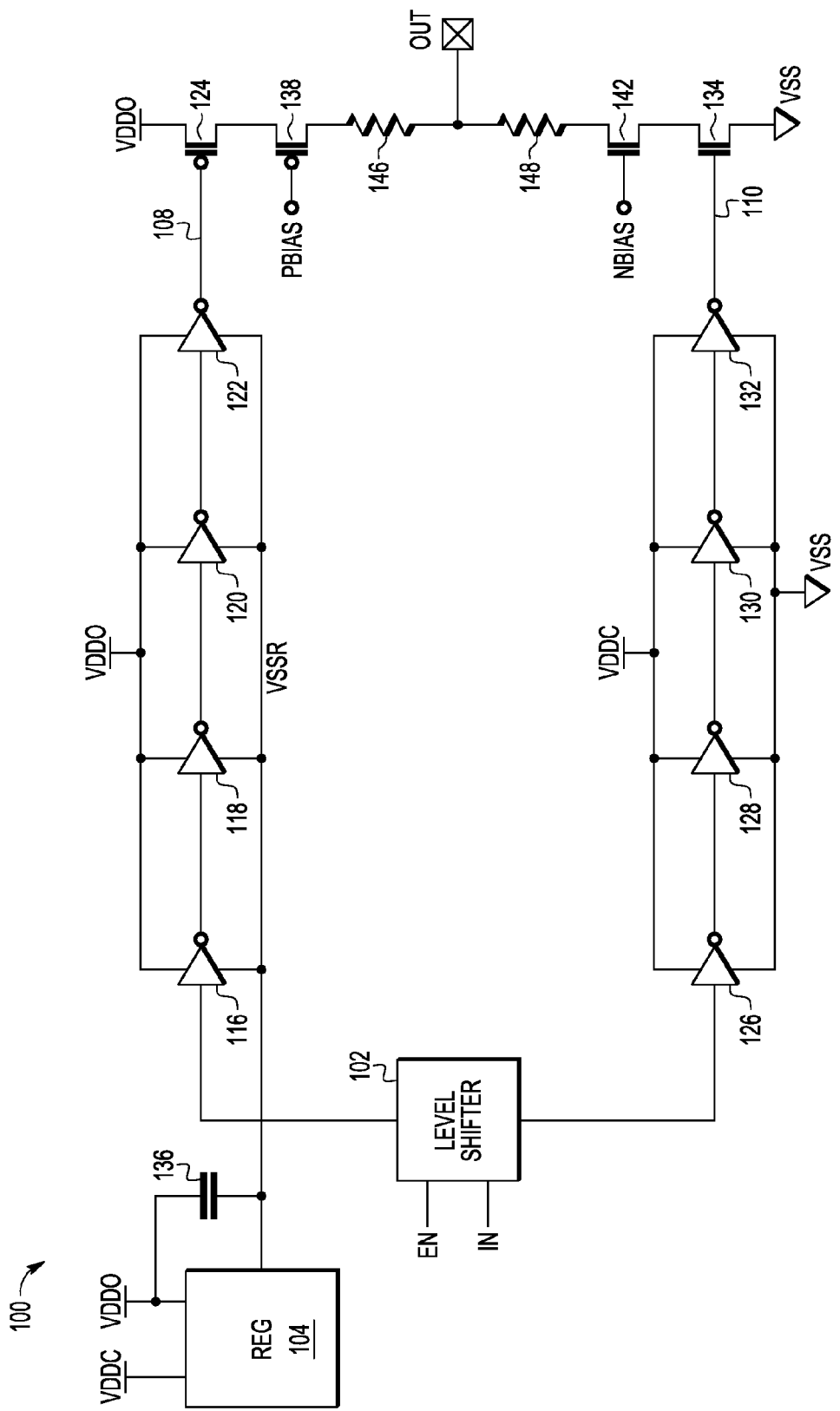
FIG. 1 is a schematic diagram showing a prior art implementation of a driver circuit.

FIG. 1 is a schematic diagram showing a prior art driver circuit 100. Driver circuit 100 includes a first plurality of series connected pre-driver inverters 116-122 to drive a PMOS driver transistor 124 and a second plurality of series connected pre-driver inverters 126-132 to drive an NMOS driver transistor 134. Inverters 116-122 receive a first power supply voltage VDDO and a relative ground voltage VSSR from voltage regulator 104. A very large decoupling capacitor 136 is connected between a VDDO supply terminal and a VSSR supply terminal to maintain charge as high frequency signals propagate through the pre-driver inverters 116-122. Inverters 126-132 receive a second power supply voltage VDDC and a third power supply voltage VSS. An input signal for the driver circuit is received at an input IN of a level shifter block 102. The level shifter block 102 includes power supply voltage inputs (not shown) to receive VDDO, VDDC, VSSR, and VSS along with an enable input EN. The driver output stage includes transistor 138 and resistor 146 coupled in series between driver output transistor 124 and driver circuit 100 OUT terminal and transistor 142 and resistor 148 coupled in series between the driver output transistor 134 and OUT terminal.

Because inverters 116-122 are formed with transistors of the same process technology as those in the core logic, the operational voltage of transistors 116-122 is the same as the operational voltage of the core logic. Therefore, the regulated relative ground voltage VSSR is at a value above ground (VSS) essentially equal to the amount of voltage that VDDO is above VDDC. For example, if VDDO is 1.2 volts, then VSSR must be 0.2 volts to maintain a 1.0 volt operational voltage.

When a signal is received at the level shifter block 102, corresponding signals are provided to the inputs of inverter 116 and inverter 126. The corresponding signals propagate through the first and second pluralities and drive the driver output transistors 124 and 134 causing the logic state at the OUT terminal to be representative of the received signal. For example, when a logic high value is received at the IN input, corresponding signals are propagated through the pre-driver inverter series turning on PMOS transistor 354 and turning off NMOS transistor 364, thus providing a logic high value at the OUT terminal.

Figure 2:
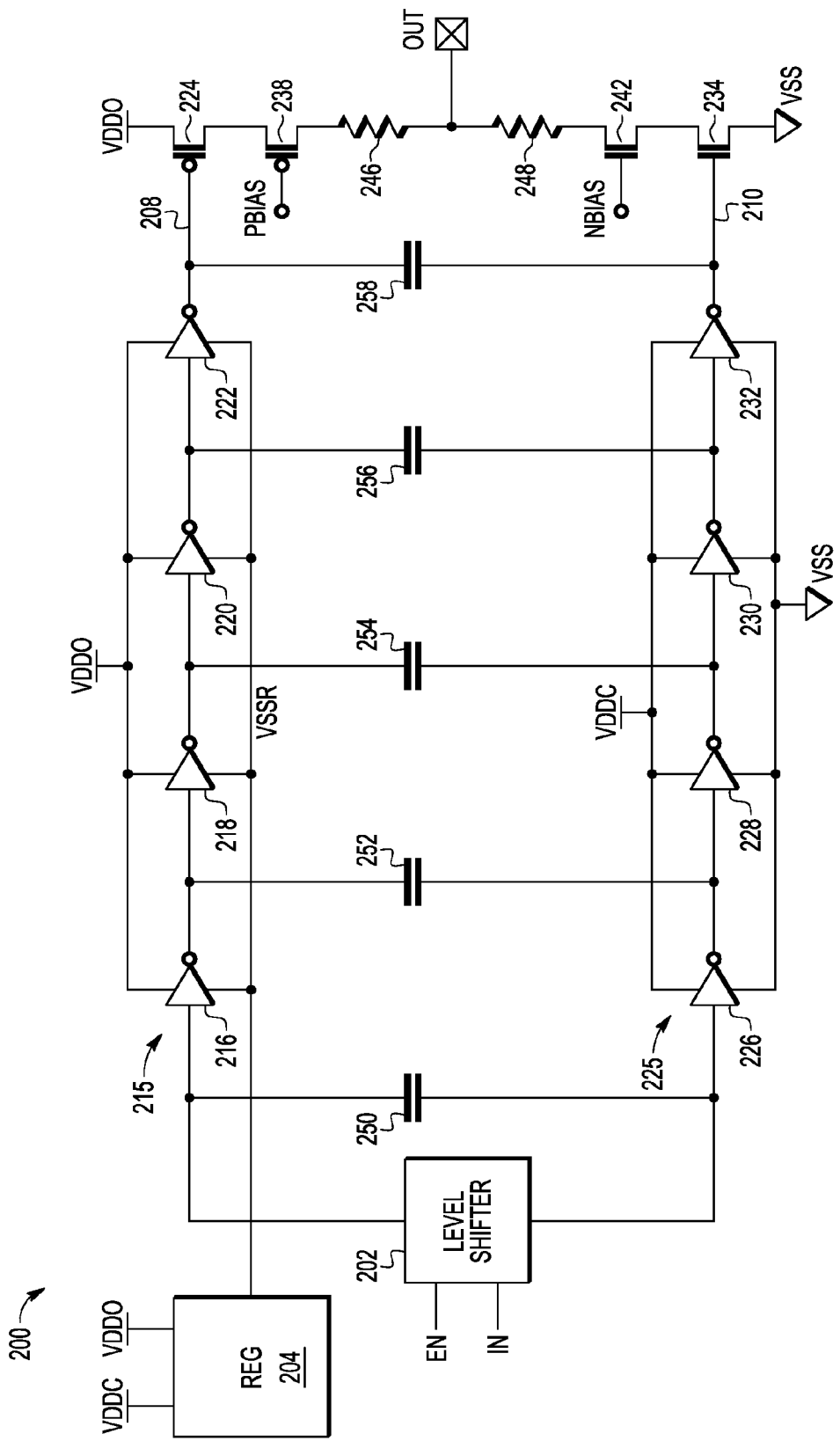
FIG. 2 is a schematic diagram showing a driver circuit using capacitively coupled pre-driver stages in accordance with an embodiment of the present disclosure.

FIG. 2 is a schematic diagram showing a driver circuit 200 using capacitively coupled pre-driver stages in accordance with an embodiment of the present disclosure. Driver circuit 200 includes a first pre-driver circuit 215, a second pre-driver circuit 225, a level shifter block 202, a voltage regulator 204, capacitors 250-258, and a driver output stage including driver output transistors 224 and 234.

The first pre-driver circuit 215 includes a first plurality of series coupled pre-driver inverters 216-222 to drive a first driver output transistor 224. Each inverter stage of the first plurality has an input terminal and an output terminal, the output terminal of one inverter coupled to an input terminal of a subsequent inverter. First inverter 216 of pre-driver circuit 215 receives a first output signal from level shifter 202 and the output of last inverter 222 provides a drive signal 208 corresponding to the received first output signal. The second pre-driver circuit 225 includes a second plurality of series coupled pre-driver inverters 226-232 to drive a second driver output transistor 234. Each inverter stage of the second plurality has an input terminal and an output terminal, the output terminal of one inverter coupled to an input terminal of a subsequent inverter. The second pre-driver circuit 225 includes the same number of inverters as the first pre-driver circuit 215. First inverter 226 of pre-driver circuit 225 receives a second output signal from level shifter 202 and the output of last inverter 232 provides a drive signal 210 corresponding to the received second output signal. In this embodiment, the first driver output transistor is a PMOS transistor and the second driver output transistor is an NMOS transistor. In some embodiments, the first pre-driver circuit 215 and the second pre-driver circuit 225 may include any number of inverters, logic gates, or transistors arranged to provide a suitable signal to drive driver output transistors 224 and 234 respectively.

In this embodiment, inverters 216-222 and 226-232 are formed in a process technology in common with the core logic components. For example, in a technology where the typical core logic components such as inverters operate in a 1.0 volt domain, inverters 216-222 and 226-232 operate in a 1.0 volt domain.

Generally, the driver output stage operates in a voltage domain different from the core logic. Suitable voltages are therefore required to control the driver output transistors. Regulator 204 is a voltage regulator which provides a regulated voltage VSSR based on the power supply voltage VDDO. In this embodiment, the regulated voltage supply VSSR has a value above VSS essentially equal to the amount of voltage that VDDO is above VDDC. For example, if VDDO has a value of 1.2 volts, then VSSR must have a value of +0.2 volts to maintain a 1.0 volt operational voltage for the inverters in the first pre-driver circuit 215. The series coupled pre-driver inverters 216-222 of the first pre-driver circuit 215 are each referenced between VDDO and VSSR and perform a buildup ratio at each inverter stage to drive driver output transistor 224. Similarly, the series coupled pre-driver inverters 226-232 of the second pre-driver circuit 225 are each referenced between VDDC and VSS and perform a buildup ratio at each inverter stage to drive driver output transistor 234.

The driver output stage includes the first driver output transistor 224 having a first current electrode coupled to the VDDO power supply, a control electrode coupled to the output terminal of the last inverter 222 in the first pre-driver circuit 215, and a second current electrode coupled to the driver circuit 200 OUT terminal, and the second transistor 234 having a first current electrode coupled to the VSS power supply, a control electrode coupled to the output terminal of the last inverter 232 in the second pre-driver circuit 225, and a second current electrode coupled to the driver circuit 200 OUT terminal. In this embodiment, the driver output stage includes transistor 238 and resistor 246 coupled in series between the second current electrode of driver output transistor 224 and driver circuit 200 OUT terminal and transistor 242 and resistor 248 coupled in series between the second current electrode of driver output transistor 234 and OUT terminal. The control electrode of transistor 238 is coupled to receive a first bias voltage (PBIAS) which may be used to control the current flow through transistor 238. The control electrode of transistor 242 is coupled to receive a second bias voltage (NBIAS) which may be used to control the current flow through transistor 242. In this embodiment, transistor 238 is a PMOS transistor and transistor 242 is an NMOS transistor. In other embodiments, transistor 238 may be an NMOS transistor and transistor 242 may be a PMOS transistor, each transistor coupled to receive a respective bias voltage.

Level shifter 202 has a first input terminal (EN) to receive an enable signal, a second input terminal (IN) to receive an input signal, a first output terminal coupled to provide a level-shifted version of the input signal to the first inverter 216 in the first pre-driver circuit 215, and a second output terminal coupled to provide a non-level-shifted version of the input signal to the first inverter 226 in the second pre-driver circuit 225. In this embodiment, the level-shifted version of the input signal transitions between VDDO and VSSR and the non-level shifter version of the input signal transitions between VDDC and VSS. In some embodiments, the first output terminal may be coupled to provide a non-level shifted signal and the second output may be coupled to provide a level-shifted output. Level shifter 202 includes power supply terminals (not shown) for VDDO, VSSR, VDDC, and VSS.

A plurality of capacitors (250-258) is coupled between corresponding inputs and outputs of inverter stages of the first pre-driver circuit and inputs and outputs of inverter stages of the second pre-driver circuit. For example, capacitor 250 is coupled between the input of inverter 216 and the input of inverter 226, capacitor 252 is coupled between the output of inverter 216 and the output of inverter 226, capacitor 254 is coupled between the output of inverter 218 and the output of inverter 228, capacitor 256 is coupled between the output of inverter 220 and the output of inverter 230, and capacitor 258 is coupled between the output of inverter 222 and the output of inverter 232. Capacitors 250-258 can be formed with any suitable materials and structures available in a given process technology such as metal-oxide-semiconductor (MOS) capacitors, metal-insulator-metal (MIM) capacitors, polysilicon-insulator-polysilicon (PIP) capacitors, deep trench capacitors, and the like, for example. Capacitors 250-258 may be formed as a combination of the above capacitor types. For example, each capacitor 250-258 may be formed as a MOS capacitor in parallel or in series with a MIM capacitor.

In this embodiment, when driver circuit 200 is enabled, level shifter 202 provides a level-shifted signal to the first inverter 216 in first pre-driver circuit 215 and a non-level-shifted signal to the first inverter 226 in second pre-driver circuit 225, based on a signal received at IN terminal. As signals propagate through the pre-driver circuits 215 and 225, the arrangement of capacitors 250-258 coupling the inverter stages of the first and second pre-driver circuits 215 and 225 allows charge to be alternately sourced from VDDC from pre-driver circuit 225 to pre-driver circuit 215, minimizing high frequency current demand from voltage regulator 204 and eliminating a need for the large decoupling capacitor 136 common with prior art regulated supplies. When driver circuit 200 is not enabled, signal values are provided to the PMOS and NMOS driver output transistors 224 and 234 such that both are turned off and OUT terminal of driver circuit 200 is characterized as being in a high-impedance state.

Figure 3:
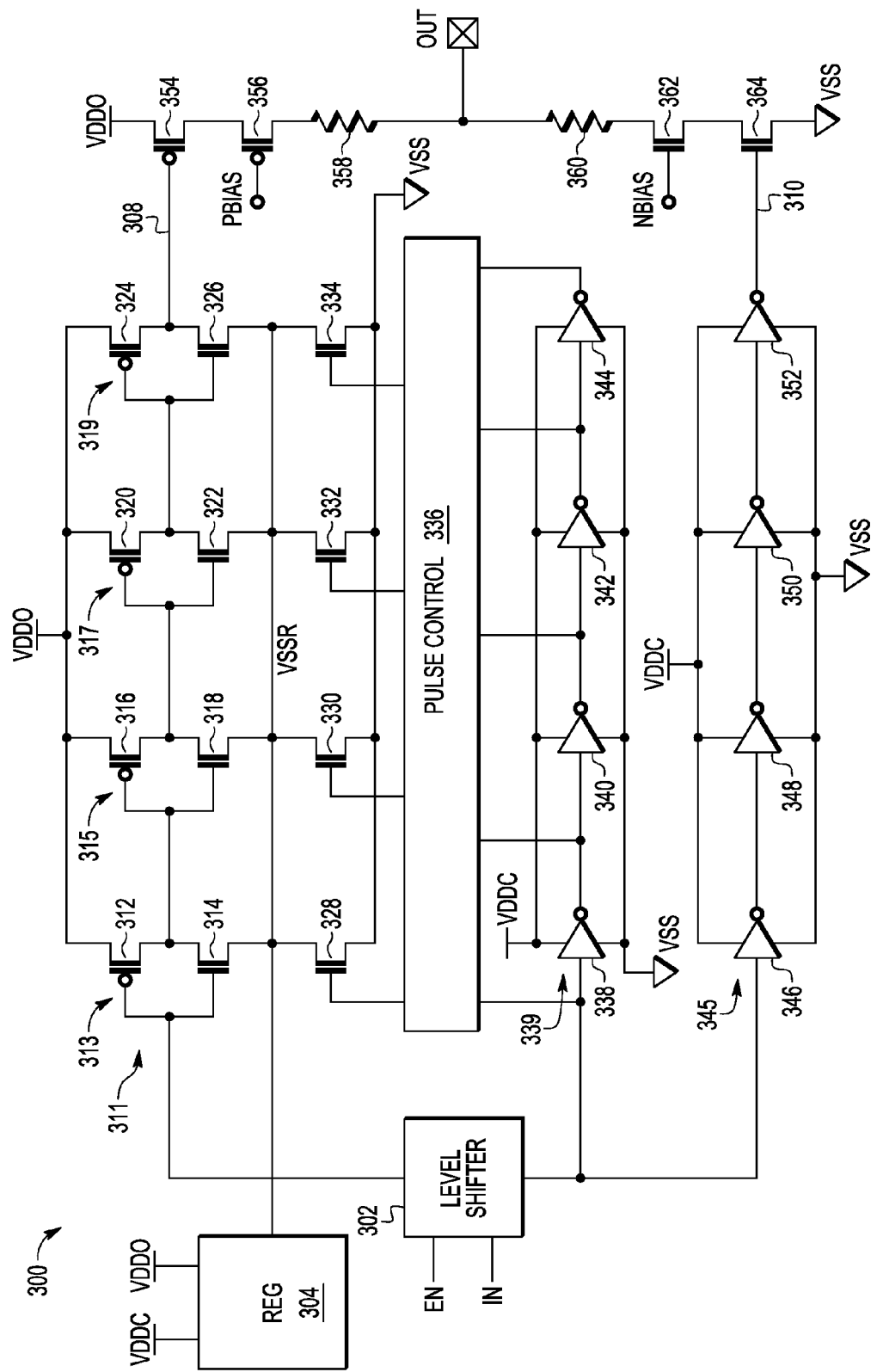
FIG. 3 is a schematic diagram showing a driver circuit using discharge circuits coupled to pre-driver stages in accordance with an embodiment of the present disclosure.

FIG. 3 is a schematic diagram showing a driver circuit 300 using discharge circuits 328-344 coupled to pre-driver stages in accordance with an embodiment of the present disclosure. Driver circuit 300 includes a first pre-driver circuit 311, a second pre-driver circuit 345, a replicated pre-driver circuit 339, a level shifter block 302, a voltage regulator 304, discharge circuits 328-334, a pulse control unit 336, and a driver output stage including driver output transistors 354 and 364. In this embodiment, the discharge circuits 328-334 are transistors.

The first pre-driver circuit 311 includes a first plurality of series coupled pre-driver inverters 313-319 to drive a first driver output transistor 354. Each inverter stage of the first plurality has an input terminal and an output terminal, the output terminal of one inverter coupled to an input terminal of a subsequent inverter. Inverter 313 includes PMOS transistor 312 and NMOS transistor 314 coupled between VDDO and VSSR power supply terminals, inverter 315 includes PMOS transistor 316 and NMOS transistor 318 coupled between VDDO and VSSR power supply terminals, inverter 317 includes PMOS transistor 320 and NMOS transistor 322 coupled between VDDO and VSSR power supply terminals, and inverter 319 includes PMOS transistor 324 and NMOS transistor 326 coupled between VDDO and VSSR power supply terminals. First inverter 313 of pre-driver circuit 311 receives a first output signal from level shifter 302 and the output of last inverter 319 provides a drive signal 308 corresponding to the received first output signal.

The second pre-driver circuit 345 includes a second plurality of series coupled pre-driver inverters 346-352 to drive a second driver output transistor 364. Each inverter stage of the second plurality has an input terminal and an output terminal, the output terminal of one inverter coupled to an input terminal of a subsequent inverter. First inverter 346 of pre-driver circuit 345 receives a second output signal from level shifter 302 and the output of last inverter 352 provides a drive signal 310 corresponding to the received second output signal. The replicated pre-driver circuit 339 is essentially a copy of the first pre-driver circuit 311 and is used for matching a propagation delay of the first pre-driver circuit 311. In some embodiments, the replicated pre-driver circuit 339 can be a copy of the second pre-driver circuit 345. The replicated pre-driver circuit 339 includes a third plurality of series coupled pre-driver inverters 338-344 similarly sized to pre-driver inverters 346-352, each inverter stage of the third plurality having an input terminal and an output terminal coupled to the pulse control unit 336. In this embodiment, the first driver output transistor 354 is a PMOS transistor and the second driver output transistor 364 is an NMOS transistor. In some embodiments, the first pre-driver circuit 311 and the second pre-driver circuit 345 may include any number of inverters, logic gates, or transistors arranged to provide a suitable signal to drive driver output transistors 354 and 364 respectively.

In this embodiment, inverters 313-319, 338-344, 346-352, and transistors 328-334 are formed in a process technology in common with core logic components. For example, in a technology where the typical core logic components such as inverters operate in a 1.0 volt domain, inverters 313-319, 338-344, 346-352, and transistors 328-334 operate in a 1.0 volt domain.

Generally, the driver output stage operates in a voltage domain different from the core logic. Suitable voltages are therefore required to control the driver output transistors. Regulator 304 is a voltage regulator which provides a regulated voltage VSSR based on the power supply voltage VDDO. In this embodiment, the regulated voltage supply VSSR has a value above VSS essentially equal to the amount of voltage that VDDO is above VDDC. For example, if VDDO has a value of 1.2 volts, then VSSR must have a value of +0.2 volts to maintain a 1.0 volt operational voltage for the inverters in the first pre-driver circuit 311. The series coupled pre-driver inverters 313-319 of the first pre-driver circuit 311 are each referenced between VDDO and VSSR and perform a buildup ratio at each inverter stage to drive driver output transistor 354. The series coupled pre-driver inverters 346-352 of the second pre-driver circuit 345 are each referenced between VDDC and VSS and perform a buildup ratio at each inverter stage to drive driver output transistor 364. Similarly, the series coupled pre-driver inverters 338-344 of the replicated pre-driver circuit 339 are each referenced between VDDC and VSS and perform a buildup ratio at each inverter stage.

The driver output stage includes the first driver output transistor 354 having a first current electrode coupled to the VDDO power supply, a control electrode coupled to the output terminal of the last inverter 319 in the first pre-driver circuit 311, and a second current electrode coupled to the driver circuit 300 OUT terminal, and the second transistor 364 having a first current electrode coupled to the VSS power supply, a control electrode coupled to the output terminal of the last inverter 352 in the second pre-driver circuit 345, and a second current electrode coupled to the driver circuit 300 OUT terminal. In this embodiment, the driver output stage includes transistor 356 and resistor 358 coupled in series between the second current electrode of driver output transistor 3544 and driver circuit 300 OUT terminal and transistor 362 and resistor 360 coupled in series between the second current electrode of driver output transistor 364 and OUT terminal. The control electrode of transistor 356 is coupled to receive a first bias voltage (PBIAS) which may be used to control the current flow through transistor 356. The control electrode of transistor 362 is coupled to receive a second bias voltage (NBIAS) which may be used to control the current flow through transistor 362. In this embodiment, transistor 356 is a PMOS transistor and transistor 362 is an NMOS transistor. In other embodiments, transistor 356 may be an NMOS transistor and transistor 362 may be a PMOS transistor, each transistor coupled to receive a respective bias voltage.

Level shifter 302 has a first input terminal (EN) to receive an enable signal, a second input terminal (IN) to receive an input signal, a first output terminal coupled to provide a level-shifted version of the input signal to the first inverter 313 in the first pre-driver circuit 311, and a second output terminal coupled to provide a non-level-shifted version of the input signal to the first inverter 346 in the second pre-driver circuit 345 and to the first inverter 338 in the replicated pre-driver circuit 339. In this embodiment, the level-shifted version of the input signal transitions between VDDO and VSSR and the non-level shifter version of the input signal transitions between VDDC and VSS. In some embodiments, the first output terminal may be coupled to provide a non-level shifted signal and the second output may be coupled to provide a level-shifted output. Level shifter 302 includes power supply terminals (not shown) for VDDO, VSSR, VDDC, and VSS.

A plurality of discharge circuits 328-334 is coupled between corresponding VSSR power supply terminals of inverter stages 313-319 of the first pre-driver circuit 311 and VSS. For example, transistor 328 is coupled between the VSSR power supply terminal of inverter 313 and VSS, transistor 330 is coupled between the VSSR power supply terminal of inverter 315 and VSS, transistor 332 is coupled between the VSSR power supply terminal of inverter 317 and VSS, and transistor 334 is coupled between the VSSR power supply terminal of inverter 319 and VSS. In this embodiment, discharge circuits 328-334 are NMOS transistors. In some embodiments, discharge circuits 328-334 can be any suitable transistors such as PMOS transistors, bipolar junction transistors, and the like, for example. In some embodiments, discharge circuits 328-334 may be sized according to transistor sizes of inverter stages 313-319. For example, transistor 328 may have width and length dimensions similar to transistor 314 of inverter 313, transistor 330 may have width and length dimensions similar to transistor 318 of inverter 315, and so on.

In this embodiment, when driver circuit 300 is enabled, level shifter 302 provides a level-shifted signal to the first inverter 313 in first pre-driver circuit 311 and a non-level-shifted signal to the first inverter 346 in second pre-driver circuit 345 and to the first inverter 338 in the replicated pre-driver circuit 339, based on a signal received at IN terminal. As signals propagate through the pre-driver circuits 311, 345, and 339, the arrangement of discharge circuits 328-334 allows excess charge to be alternately discharged to VSS, minimizing amount of regulation needed from voltage regulator 304. Pulse control unit 336 includes inputs coupled to input and output taps of inverter stages 338-344 of replicated pre-driver circuit 339 and outputs coupled to the control electrodes of transistors 328-334. As signals propagate through inverter stages 338-344, pulse control unit 336 combines received signals at the inputs and forms pulses which are provided to the control electrodes of transistors 328-334. For example, combinational logic in the pulse control unit 336 can receive the signals from a tap at the input of inverter 338 and a tap at the output of inverter 342 and using the delay from the input of inverter 338 to the output of inverter 342 to generate a pulse for the duration that a high-to-low or low-to-high logic signal transition would take propagating the transition from inverter 338 through inverter 342. The duration of pulses generated by the pulse control unit 336 are sufficient to control discharge circuits 328-334 whereby excess charge accumulated on VSSR can be discharged.

When driver circuit 300 is not enabled, signal values are provided to the PMOS and NMOS driver output transistors 354 and 364 such that both are turned off and OUT terminal of driver circuit 300 is characterized as being in a high-impedance state.

Figure 4:
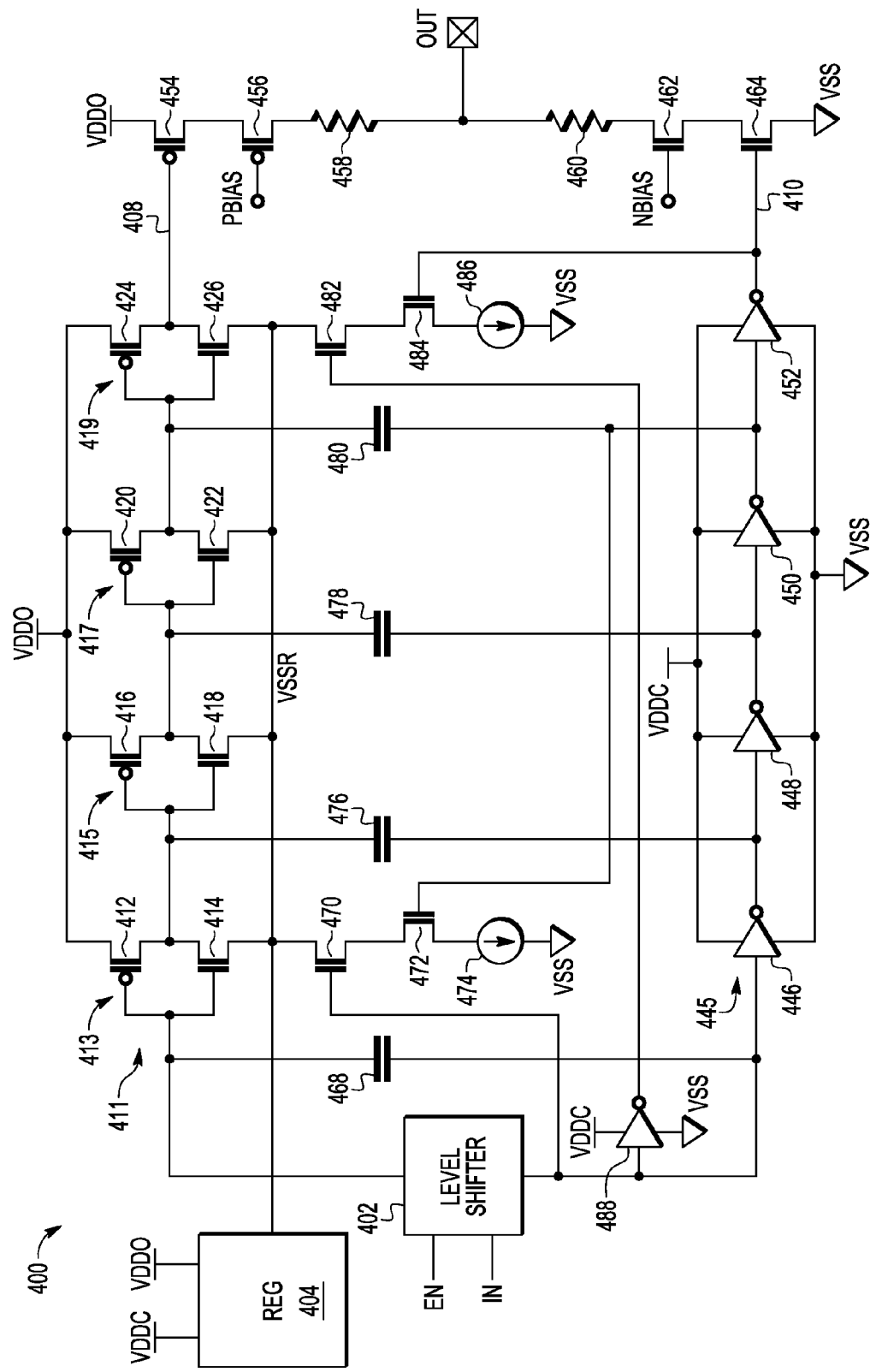
FIG. 4 is a schematic diagram showing a driver circuit using capacitively coupled pre-driver stages and discharge circuits in accordance with an embodiment of the present disclosure.

FIG. 4 is a schematic diagram showing a driver circuit 400 using capacitively coupled pre-driver stages and discharge circuits in accordance with an embodiment of the present disclosure. Driver circuit 400 includes a first pre-driver circuit 411, a second pre-driver circuit 445, a level shifter block 402, a voltage regulator 404, capacitors 468, 476-480, a first discharge circuit including select transistors 470-472, a second discharge circuit including select transistors 482-484, and a driver output stage including driver output transistors 454 and 464.

The first pre-driver circuit 411 includes a first plurality of series coupled pre-driver inverters 413-419 to drive a first driver output transistor 454. Each inverter stage of the first plurality has an input terminal and an output terminal, the output terminal of one inverter coupled to an input terminal of a subsequent inverter. Inverter 413 includes PMOS transistor 412 and NMOS transistor 414 coupled between VDDO and VSSR power supply terminals, inverter 415 includes PMOS transistor 416 and NMOS transistor 418 coupled between VDDO and VSSR power supply terminals, inverter 417 includes PMOS transistor 420 and NMOS transistor 422 coupled between VDDO and VSSR power supply terminals, and inverter 419 includes PMOS transistor 424 and NMOS transistor 426 coupled between VDDO and VSSR power supply terminals. First inverter 413 of pre-driver circuit 411 receives a first output signal from level shifter 402 and the output of last inverter 419 provides a drive signal 408 corresponding to the received first output signal.

The second pre-driver circuit 445 includes a second plurality of series coupled pre-driver inverters 446-452 to drive a second driver output transistor 464. Each inverter stage of the second plurality has an input terminal and an output terminal, the output terminal of one inverter coupled to an input terminal of a subsequent inverter. First inverter 446 of pre-driver circuit 445 receives a second output signal from level shifter 402 and the output of last inverter 452 provides a drive signal 410 corresponding to the received second output signal. In this embodiment, the first driver output transistor 454 is a PMOS transistor and the second driver output transistor 464 is an NMOS transistor. In some embodiments, the first pre-driver circuit 411 and the second pre-driver circuit 445 may include any number of inverters, logic gates, or transistors arranged to provide a suitable signal to drive driver output transistors 454 and 464 respectively.

In this embodiment, pre-driver inverters 413-419 and 446-452 and select transistors 470, 472, 478, 480 are formed in a process technology in common with core logic components. For example, in a technology where the typical core logic components such as inverters operate in a 1.0 volt domain, inverters 413-419 and 446-452 and select transistors 470, 472, 478, 480 operate in a 1.0 volt domain.

Generally, the driver output stage operates in a voltage domain different from the core logic. Suitable voltages are therefore required to control the driver output transistors. Regulator 404 is a voltage regulator which provides a regulated voltage VSSR based on the power supply voltage VDDO. In this embodiment, the regulated voltage supply VSSR has a value above VSS essentially equal to the amount of voltage that VDDO is above VDDC. For example, if VDDO has a value of 1.2 volts, then VSSR must have a value of +0.2 volts to maintain a 1.0 volt operational voltage for the inverters in the first pre-driver circuit 411. The series coupled pre-driver inverters 413-419 of the first pre-driver circuit 411 are each referenced between VDDO and VSSR and perform a buildup ratio at each inverter stage to drive driver output transistor 454. The series coupled pre-driver inverters 446-452 of the second pre-driver circuit 445 are each referenced between VDDC and VSS and perform a buildup ratio at each inverter stage to drive driver output transistor 464.

The driver output stage includes the first driver output transistor 454 having a first current electrode coupled to the VDDO power supply, a control electrode coupled to the output terminal of the last inverter 419 in the first pre-driver circuit 411, and a second current electrode coupled to the driver circuit 400 OUT terminal, and the second transistor 464 having a first current electrode coupled to the VSS power supply, a control electrode coupled to the output terminal of the last inverter 452 in the second pre-driver circuit 445, and a second current electrode coupled to the driver circuit 400 OUT terminal. In this embodiment, the driver output stage includes transistor 456 and resistor 458 coupled in series between the second current electrode of driver output transistor 454 and driver circuit 400 OUT terminal and transistor 462 and resistor 460 coupled in series between the second current electrode of driver output transistor 464 and OUT terminal. The control electrode of transistor 456 is coupled to receive a first bias voltage (PBIAS) which may be used to control the current flow through transistor 456. The control electrode of transistor 462 is coupled to receive a second bias voltage (NBIAS) which may be used to control the current flow through transistor 462. In this embodiment, transistor 456 is a PMOS transistor and transistor 462 is an NMOS transistor. In other embodiments, transistor 456 may be an NMOS transistor and transistor 462 may be a PMOS transistor, each transistor coupled to receive a respective bias voltage.

Level shifter 402 has a first input terminal (EN) to receive an enable signal, a second input terminal (IN) to receive an input signal, a first output terminal coupled to provide a level-shifted version of the input signal to the first inverter 413 in the first pre-driver circuit 411, and a second output terminal coupled to provide a non-level-shifted version of the input signal to the first inverter 446 in the second pre-driver circuit 445. In this embodiment, the level-shifted version of the input signal transitions between VDDO and VSSR and the non-level shifter version of the input signal transitions between VDDC and VSS. In some embodiments, the first output terminal may be coupled to provide a non-level shifted signal and the second output may be coupled to provide a level-shifted output. Level shifter 402 includes power supply terminals (not shown) for VDDO, VSSR, VDDC, and VSS.

A plurality of capacitors (468, 476-480) is coupled between corresponding inputs and outputs of inverter stages of the first pre-driver circuit 411 and inputs and outputs of inverter stages of the second pre-driver circuit 445. For example, capacitor 468 is coupled between the input of inverter 413 and the input of inverter 446, capacitor 476 is coupled between the output of inverter 413 and the output of inverter 446, capacitor 478 is coupled between the output of inverter 415 and the output of inverter 448, and capacitor 480 is coupled between the output of inverter 417 and the output of inverter 450. Capacitors 468 and 476-480 can be formed with any suitable materials and structures available in a given process technology such as metal-oxide-semiconductor (MOS) capacitors, metal plate capacitors or metal-insulator-metal (MIM) capacitors, polysilicon-insulator-polysilicon (PIP) capacitors, deep trench capacitors, and the like, for example. Capacitors 468 and 476-480 may be formed as a combination of the above capacitor types. For example, each capacitor 468 and 476-480 may be formed as a MOS capacitor in parallel or in series with a MIM capacitor.

A plurality of discharge circuits are coupled between corresponding VSSR power supply terminals of inverter stages 413 and 419 of the first pre-driver circuit 411 and VSS. For example, the first discharge circuit is coupled between the VSSR power supply terminal of inverter 413 and VSS and the second discharge circuit is coupled between the VSSR power supply terminal of inverter 419 and VSS. In this embodiment, the first discharge circuit includes select transistors 470-472 and a first current source 474 coupled in series between the VSSR power supply terminal of inverter 413 and VSS. For example, a first current electrode of transistor 470 is coupled to the VSSR power supply terminal, a control electrode is coupled to receive a first signal based on a signal received at the IN input, and a second current electrode is coupled to a first current electrode of transistor 472. Transistor 472 has a control electrode coupled to receive a second signal based on the signal received at the IN input, and a second current electrode is coupled a first terminal of a current source 474. The second terminal of the current source 474 is coupled to VSS. In this example, the first signal and the second signal are complementary to each other. Because the second signal has a longer delay than the first signal, both transistors 470 and 472 may be turned on allowing current to be discharged through current source 474 during an amount of time that the second signal is delayed longer than the first signal.

The second discharge circuit includes select transistors 482-484 and a second current source 486 coupled in series between the VSSR power supply terminal of inverter 419 and VSS. For example, a first current electrode of transistor 482 is coupled to the VSSR power supply terminal, a control electrode is coupled to receive a third signal based on a signal received at the IN input, and a second current electrode is coupled to a first current electrode of transistor 484. Transistor 484 has a control electrode coupled to receive a fourth signal based on the signal received at the IN input, and a second current electrode is coupled a first terminal of a current source 486. The second terminal of the current source 486 is coupled to VSS. In this example, the third signal and the fourth signal are complementary to each other. Because the fourth signal has a longer delay than the third signal, both transistors 482 and 484 may be turned on allowing current to be discharged through current source 486 during an amount of time that the fourth signal is delayed longer than the third signal.

In this embodiment, discharge circuit select transistors 470-472 and 482-484 are NMOS transistors. In some embodiments, select transistors 470-472 and 482-484 can be any suitable transistors such as PMOS transistors, bipolar junction transistors, and the like, for example. In some embodiments, select transistors 470-472 and 482-484 may be sized according to transistor sizes of inverter stages 413-419. For example, transistors 470-472 may have width and length dimensions similar or proportional to transistor 414 of inverter 413, and transistors 482-484 may have width and length dimensions similar or proportional to transistor 426 of inverter 419.

When driver circuit 400 is enabled in this embodiment, level shifter 402 provides a level-shifted signal to the first inverter 413 in first pre-driver circuit 411 and a non-level-shifted signal to the first inverter 446 in second pre-driver circuit 445, based on a signal received at IN terminal. Inverter 488 is coupled to provide a complement version of the non-level shifted signal to the control electrode of select transistor 482. Taps at the outputs of inverters 450 and 452 are coupled to provide complement and true versions of the non-level-shifted signal to the control electrodes of select transistors 472 and 484 respectively. As signals propagate through the pre-driver circuits 411 and 445, the discharge circuits allow excess charge to be discharged to VSS, minimizing regulation needed from voltage regulator 404. For example, in response to a low-to-high logic signal transition at the IN input, select transistors 470 and 472 of the first discharge circuit are mutually conducting during the propagation delay of the transition, causing charge to be discharged to VSS via current source 474. Similarly, in response to a high-to-low logic signal transition at the IN input, select transistors 482 and 484 of the second discharge circuit are mutually conducting during the propagation delay of the transition, causing current to be discharged to VSS via current source 486. The arrangement of capacitors 468 and 476-480 coupling the inverter stages of the first and second pre-driver circuits 411 and 445 allows charge to be sourced from VDDC, minimizing high frequency current demand from voltage regulator 404.

When driver circuit 400 is not enabled, signal values are provided to the PMOS and NMOS driver output transistors 454 and 464 such that both are turned off and OUT terminal of driver circuit 400 is characterized as being in a high-impedance state.

Generally, there is provided, a driver circuit including: a first plurality of series-connected inverters, each inverter having an input terminal and an output terminal, the output terminal of one inverter coupled to an input terminal of a subsequent inverter; a second plurality of series-connected inverters, each inverter having an input terminal and an output terminal, the output terminal of one inverter coupled to an input of a subsequent inverter, the second plurality of series-connected inverters having a same number of inverters as the first plurality of series-connected inverters; a first transistor having a first current electrode coupled to a first power supply terminal, a control electrode coupled to the output terminal of a last inverter in the first plurality of series-connected inverters, and a second current electrode coupled to an output terminal; a second transistor having a first current electrode coupled to the output terminal, a control electrode coupled to the output terminal of a last inverter in the second plurality of series-connected inverters, and a second current electrode coupled to a second power supply terminal; and a plurality of capacitors, each capacitor of the plurality of capacitors coupled between the output terminals of corresponding inverters of the first and second pluralities of series-connected inverters. The first plurality of series-connected inverters may receive a first power supply voltage and the second plurality of series-connected inverters may receive a second power supply voltage different from the first power supply voltage.

Each inverter of the first plurality of series-connected inverters may have a first power supply terminal coupled to receive the first power supply voltage, and a second power supply terminal coupled to receive a second power supply voltage regulated to a predetermined voltage level above ground. Each inverter of the second plurality of series-connected inverters may have a first power supply terminal coupled to receive a third power supply voltage, and a second power supply voltage terminal coupled to ground, wherein the third power supply voltage may be less than the first power supply voltage. The driver circuit may further include a first discharge circuit coupled between the second power supply terminal and ground, the first discharge circuit for discharging the second power supply terminal of the first plurality of series-connected inverters in response to a transition of an input signal of the driver circuit from a first logic level to a second logic level. The driver circuit may further include a second discharge circuit coupled between the second power supply terminal and ground, the second discharge circuit for discharging the second power supply terminal of the first plurality of series-connected inverters in response to a transition of the input signal of the driver circuit from the second logic level to the first logic level. The first and second discharge circuits may discharge the second power supply terminal of the first plurality of series-connected inverters for a predetermined time period. The driver circuit may further include a level shifter having an input terminal for receiving an input signal, a first output terminal for providing a level shifted input signal, the first output terminal coupled to an input terminal of a first inverter of the first plurality of series-connected inverters, and a second output terminal coupled to an input terminal of a first inverter of the second plurality of series-connected inverters.

In another embodiment, there is provided, a driver circuit including: a first plurality of series-connected inverters, each inverter having an input terminal and an output terminal, the output terminal of one inverter coupled to an input terminal of a subsequent inverter, wherein each inverter of the first plurality of series-connected inverters has a first power supply terminal coupled to receive a first power supply voltage, and a second power supply terminal coupled to receive a second power supply voltage regulated to a predetermined voltage level above ground; a second plurality of series-connected inverters, each inverter having an input terminal and an output terminal, the output terminal of one inverter coupled to an input of a subsequent inverter, the second plurality of series-connected inverters having a same number of inverters as the first plurality of series-connected inverters; a first transistor having a first current electrode coupled to the first power supply terminal, a control electrode coupled to the output terminal of a last inverter in the first plurality of series-connected inverters, and a second current electrode coupled to an output terminal; a second transistor having a first current electrode coupled to the output terminal, a control electrode coupled to the output terminal of a last inverter in the second plurality of series-connected inverters, and a second current electrode coupled to a second power supply terminal; a plurality of capacitors, each capacitor of the plurality of capacitors coupled between the output terminals of corresponding inverters of the first and second pluralities of series-connected inverters; and a first discharge circuit coupled between the second power supply terminal and ground, the first discharge circuit for discharging the second power supply terminal of the first plurality of series-connected inverters in response to a transition of an input signal of the driver circuit from a first logic level to a second logic level. The driver circuit may further include a level shifter having an input terminal for receiving the input signal, a first output terminal for providing a level shifted input signal, the first output terminal coupled to an input terminal of a first inverter of the first plurality of series-connected inverters, and a second output terminal coupled to an input terminal of a first inverter of the second plurality of series-connected inverters. The first discharge circuit may include: a third transistor having a first current electrode coupled to the second power supply voltage terminal, a control electrode coupled to receive a first signal based on the input signal, and a second current electrode; a fourth transistor having a first current electrode coupled to the second current electrode of the third transistor, a control electrode coupled to receive a second signal based on the input signal, and a second current electrode, the second signal having a longer delay than the first signal; and a current source having a first terminal coupled to the second current electrode of the fourth transistor, and a second terminal coupled to ground. The plurality of capacitors may include a plurality of metal plate capacitors. The second plurality of series-connected inverters may receive a second power supply voltage different from the first power supply voltage. Each inverter of the second plurality of series-connected inverters may have a first power supply terminal coupled to receive a third power supply voltage, and a second power supply voltage terminal coupled to ground, wherein the third power supply voltage is lower than the first power supply voltage.

In yet another embodiment, there is provided, a driver circuit including: a first plurality of series-connected inverters, each inverter having an input terminal and an output terminal, the output terminal of one inverter coupled to an input terminal of a subsequent inverter, wherein each inverter of the first plurality of series-connected inverters has a first power supply terminal coupled to receive a first power supply voltage, and a second power supply terminal coupled to receive a second power supply voltage regulated to a predetermined voltage level above ground; a second plurality of series-connected inverters, each inverter having an input terminal and an output terminal, the output terminal of one inverter coupled to an input of a subsequent inverter, the second plurality of series-connected inverters having a same number of inverters as the first plurality of series-connected inverters; a first transistor having a first current electrode coupled to the first power supply terminal, a control electrode coupled to the output terminal of a last inverter in the first plurality of series-connected inverters, and a second current electrode coupled to an output terminal; a second transistor having a first current electrode coupled to the output terminal, a control electrode coupled to the output terminal of a last inverter in the second plurality of series-connected inverters, and a second current electrode coupled to a third power supply terminal; and a plurality of discharge circuits, each discharge circuit of the plurality of discharge circuits coupled between the second power supply terminal and ground, the plurality of discharge circuits for discharging the second power supply terminal of the plurality of series-connected inverters in response to a transition of an input signal of the driver circuit from a first logic level to a second logic level. Each discharge circuit of the plurality of discharge circuits may include a transistor, wherein the transistor is coupled between the second power supply terminal and ground, and wherein the transistor having a control electrode is coupled to receive a control signal. The driver circuit may further include a pulse control circuit, the pulse control circuit for providing a plurality of delay signals, a delay signal of the plurality of delay signals being provided to the control electrode of the transistor of the plurality of discharge circuits, wherein the pulse control circuit causing the plurality of discharge circuits to become conductive one at time in a staggered manner. The driver circuit may further include a replica delay path coupled to the pulse control circuit, the replica delay path for matching a propagation delay of the first plurality of series-connected inverters, and for providing the plurality of delay signals. The driver circuit may further include a level shifter having an input terminal for receiving an input signal, a first output terminal for providing a level shifted input signal, the first output terminal coupled to an input terminal of a first inverter of the first plurality of series-connected inverters, and a second output terminal coupled to an input terminal of a first inverter of the second plurality of series-connected inverters. The plurality of discharge circuits may include a first discharge circuit and a second discharge circuit, the first discharge circuit coupled between the second power supply terminal and ground of a first inverter of the first plurality of series-connected inverters, and a second inverter coupled to a last inverter of the first plurality of series-connected inverters, and the driver circuit further comprising a plurality of capacitors, each capacitor of the plurality of capacitors coupled between the output terminals of corresponding inverters of the first and second pluralities of series-connected inverters.

By now it should be appreciated that there has been provided driver circuits in multi-voltage domains which minimizes overall high frequency current demand on the regulator and improves low-frequency voltage regulation, ensuring reduced data-dependent jitter and overall enhanced stability.

The terms "assert" or "set" and "negate" (or "deassert" or "clear"), if any, are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different logic and circuitry. For example, although FIG. 2 and the discussion thereof describe an exemplary circuit, this exemplary circuit is presented merely to provide a useful reference in discussing various aspects of the invention. Of course, the description of the circuit has been simplified for purposes of discussion, and it is just one of many different types of appropriate circuits that may be used in accordance with the invention. Those skilled in the art will recognize that the boundaries between circuit elements or components are merely illustrative and that alternative embodiments may merge logic blocks or circuit elements or impose an alternate decomposition of functionality upon various circuit elements or components. Thus, it is to be understood that the circuitries depicted herein are merely exemplary, and that in fact other circuits can be implemented which achieve the same functionality.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A driver circuit comprising:
   a first plurality of series-connected inverters, each inverter having an input terminal and an output terminal, the output terminal of one inverter coupled to an input terminal of a subsequent inverter;
   a second plurality of series-connected inverters, each inverter having an input terminal and an output terminal, the output terminal of one inverter coupled to an input of a subsequent inverter, the second plurality of series-connected inverters having a same number of inverters as the first plurality of series-connected inverters;
   a first transistor having a first current electrode coupled to a first power supply terminal, a control electrode coupled to the output terminal of a last inverter in the first plurality of series-connected inverters, and a second current electrode coupled to an output terminal;
   a second transistor having a first current electrode coupled to the output terminal, a control electrode coupled to the output terminal of a last inverter in the second plurality of series-connected inverters, and a second current electrode coupled to a second power supply terminal; and a plurality of capacitors, each capacitor of the plurality of capacitors coupled between the output terminals of corresponding inverters of the first and second pluralities of series-connected inverters.

2. The driver circuit of claim 1, wherein the first plurality of series-connected inverters receive a first power supply voltage and the second plurality of series-connected inverters receive a second power supply voltage different from the first power supply voltage.

3. The driver circuit of claim 1, wherein each inverter of the first plurality of series-connected inverters has a first power supply terminal coupled to receive the first power supply voltage, and a second power supply terminal coupled to receive a second power supply voltage regulated to a predetermined voltage level above ground.

4. The driver circuit of claim 3, wherein each inverter of the second plurality of series-connected inverters has a first power supply terminal coupled to receive a third power supply voltage, and a second power supply voltage terminal coupled to ground, wherein the third power supply voltage is less than the first power supply voltage.

5. The driver circuit of claim 1, further comprising a level shifter having an input terminal for receiving an input signal, a first output terminal for providing a level shifted input signal, the first output terminal coupled to an input terminal of a first inverter of the first plurality of series-connected inverters, and a second output terminal coupled to an input terminal of a first inverter of the second plurality of series-connected inverters.

6. A driver circuit comprising:
   a first plurality of series-connected inverters, each inverter having an input terminal and an output terminal, the output terminal of one inverter coupled to an input terminal of a subsequent inverter, wherein each inverter of the first plurality of series-connected inverters has a first power supply terminal coupled to receive a first power supply voltage, and a second power supply terminal coupled to receive a second power supply voltage regulated to a predetermined voltage level above ground;
   a second plurality of series-connected inverters, each inverter having an input terminal and an output terminal, the output terminal of one inverter coupled to an input of a subsequent inverter, the second plurality of series-connected inverters having a same number of inverters as the first plurality of series-connected inverters;
   a first transistor having a first current electrode coupled to the first power supply terminal, a control electrode coupled to the output terminal of a last inverter in the first plurality of series-connected inverters, and a second current electrode coupled to an output terminal;
   a second transistor having a first current electrode coupled to the output terminal, a control electrode coupled to the output terminal of a last inverter in the second plurality of series-connected inverters, and a second current electrode coupled to a third power supply terminal;
   a plurality of capacitors, each capacitor of the plurality of capacitors coupled between the output terminals of corresponding inverters of the first and second pluralities of series-connected inverters; and
   a first discharge circuit coupled between the second power supply terminal and ground, the first discharge circuit for discharging the second power supply terminal of the first plurality of series-connected inverters in response to a transition of an input signal of the driver circuit from a first logic level to a second logic level.

7. The driver circuit of claim 6, further comprising a second discharge circuit coupled between the second power supply terminal and ground, the second discharge circuit for discharging the second power supply terminal of the first plurality of series-connected inverters in response to a transition of the input signal of the driver circuit from the second logic level to the first logic level.

8. The driver circuit of claim 7, wherein the first and second discharge circuits discharge the second power supply terminal of the first plurality of series-connected inverters for a predetermined time period.

9. The driver circuit of claim 6, further comprising a level shifter having an input terminal for receiving the input signal, a first output terminal for providing a level shifted input signal, the first output terminal coupled to an input terminal of a first inverter of the first plurality of series-connected inverters, and a second output terminal coupled to an input terminal of a first inverter of the second plurality of series-connected inverters.

10. The driver circuit of claim 6, wherein the first discharge circuit comprises:
    a third transistor having a first current electrode coupled to the second power supply voltage terminal, a control electrode coupled to receive a first signal based on the input signal, and a second current electrode;
    a fourth transistor having a first current electrode coupled to the second current electrode of the third transistor, a control electrode coupled to receive a second signal based on the input signal, and a second current electrode, the second signal having a longer delay than the first signal; and
    a current source having a first terminal coupled to the second current electrode of the fourth transistor, and a second terminal coupled to ground.

11. The driver circuit of claim 6, wherein the plurality of capacitors comprises a plurality of metal plate capacitors.

12. The driver circuit of claim 6, wherein the second plurality of series-connected inverters receives a third power supply voltage different from the first power supply voltage.

13. The driver circuit of claim 6, wherein each inverter of the second plurality of series-connected inverters has a first power supply terminal coupled to receive a third power supply voltage, and a second power supply voltage terminal coupled to ground, wherein the third power supply voltage is lower than the first power supply voltage.

14. A driver circuit comprising:
    a first plurality of series-connected inverters, each inverter having an input terminal and an output terminal, the output terminal of one inverter coupled to an input terminal of a subsequent inverter, wherein each inverter of the first plurality of series-connected inverters has a first power supply terminal coupled to receive a first power supply voltage, and a second power supply terminal coupled to receive a second power supply voltage regulated to a predetermined voltage level above ground;
    a second plurality of series-connected inverters, each inverter having an input terminal and an output terminal, the output terminal of one inverter coupled to an input of a subsequent inverter, the second plurality of series-connected inverters having a same number of inverters as the first plurality of series-connected inverters;
    a first transistor having a first current electrode coupled to the first power supply terminal, a control electrode coupled to the output terminal of a last inverter in the first plurality of series-connected inverters, and a second current electrode coupled to an output terminal;

a second transistor having a first current electrode coupled to the output terminal, a control electrode coupled to the output terminal of a last inverter in the second plurality of series-connected inverters, and a second current electrode coupled to a third power supply terminal; and a plurality of discharge circuits, each discharge circuit of the plurality of discharge circuits coupled between the second power supply terminal and ground, the plurality of discharge circuits for discharging the second power supply terminal of the plurality of series-connected inverters in response to a transition of an input signal of the driver circuit from a first logic level to a second logic level.

15. The driver circuit of claim 14, wherein each discharge circuit of the plurality of discharge circuits comprising a transistor, wherein the transistor is coupled between the second power supply terminal and ground, and wherein the transistor having a control electrode coupled to receive a control signal.

16. The driver circuit of claim 15, further comprising a pulse control circuit, the pulse control circuit for providing a plurality of delay signals, a delay signal of the plurality of delay signals being provided to the control electrode of the transistor of the plurality of discharge circuits, wherein the pulse control circuit causing the plurality of discharge circuits to become conductive one at time in a staggered manner.

17. The driver circuit of claim 16 further comprising a replica delay path coupled to the pulse control circuit, the replica delay path for matching a propagation delay of the first plurality of series-connected inverters, and for providing the plurality of delay signals.

18. The driver circuit of claim 14 further comprising a level shifter having an input terminal for receiving an input signal, a first output terminal for providing a level shifted input signal, the first output terminal coupled to an input terminal of a first inverter of the first plurality of series-connected inverters, and a second output terminal coupled to an input terminal of a first inverter of the second plurality of series-connected inverters.

19. The driver circuit of claim 14 wherein the plurality of discharge circuits comprising a first discharge circuit and a second discharge circuit, the first discharge circuit coupled between the second power supply terminal and ground of a first inverter of the first plurality of series-connected inverters, and a second inverter coupled to a last inverter of the first plurality of series-connected inverters, and the driver circuit further comprising a plurality of capacitors, each capacitor of the plurality of capacitors coupled between the output terminals of corresponding inverters of the first and second pluralities of series-connected inverters.

* * * * *